(12) United States Patent
Barsun et al.

(10) Patent No.: US 7,436,674 B2
(45) Date of Patent: Oct. 14, 2008

(54) ELECTRONIC DEVICE DISPLAY PANEL

(75) Inventors: Stephan K. Barsun, Sacramento, CA (US); Kevin E. Boyum, Roseville, CA (US); Bryan D. Bolich, Davis, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 456 days.

(21) Appl. No.: 11/104,252

(22) Filed: Apr. 12, 2005

(65) Prior Publication Data

US 2006/0227154 A1    Oct. 12, 2006

(51) Int. Cl.
- H05K 5/00 (2006.01)
- H05K 7/00 (2006.01)
- H05K 7/16 (2006.01)
- G06F 3/02 (2006.01)
- G06F 1/16 (2006.01)
- G09G 5/00 (2006.01)
- A47B 81/00 (2006.01)
- A47B 97/00 (2006.01)

(52) U.S. Cl. .......... 361/727; 361/681; 361/725; 312/223.1; 312/223.2; 345/169; 345/170

(58) Field of Classification Search .......... 361/679, 361/681, 683, 724, 727, 725; 312/7.2, 319.6, 312/223.1, 223.2; 345/905, 169, 170; 248/920; 348/836, 837, 794

See application file for complete search history.

(56) References Cited

U.S. PATENT DOCUMENTS

| | | | |
|---|---|---|---|
| 4,589,659 A | 5/1986 | Yokoi et al. | |
| 4,762,378 A | 8/1988 | Kagami | |
| 5,161,028 A * | 11/1992 | Kawata et al. | 348/837 |
| 5,168,423 A | 12/1992 | Ohgami et al. | |
| 5,168,426 A | 12/1992 | Hoving et al. | |
| 5,173,686 A * | 12/1992 | Fujihara | 345/87 |
| 5,175,672 A | 12/1992 | Conner et al. | |
| 5,566,048 A | 10/1996 | Esterberg et al. | |
| 5,708,561 A | 1/1998 | Huilgol et al. | |
| 5,838,536 A | 11/1998 | Miyazwa et al. | |
| 5,870,280 A | 2/1999 | Cho | |
| 5,923,528 A | 7/1999 | Lee | |
| 6,144,549 A * | 11/2000 | Moss et al. | 361/681 |
| 6,185,092 B1 * | 2/2001 | Landrum et al. | 361/683 |
| 6,189,850 B1 | 2/2001 | Liao et al. | |
| 6,219,323 B1 * | 4/2001 | Fukatsu et al. | 720/650 |
| 6,233,138 B1 | 5/2001 | Osgood | |
| 6,407,933 B1 * | 6/2002 | Bolognia et al. | 361/826 |
| 6,433,791 B2 | 8/2002 | Selli et al. | |
| 6,445,573 B1 | 9/2002 | Portman et al. | |
| 6,510,049 B2 | 1/2003 | Rosen | |
| 6,530,784 B1 | 3/2003 | Yim et al. | |
| 6,587,333 B2 | 7/2003 | Tseng et al. | |
| 6,654,236 B2 | 11/2003 | Chen et al. | |
| 6,657,857 B2 | 12/2003 | Lan | |
| 6,778,381 B1 * | 8/2004 | Bolognia et al. | 361/681 |
| 6,791,826 B2 | 9/2004 | Ho | |

(Continued)

OTHER PUBLICATIONS

Drop-down Light Path Diagnostics Panel, IBM@server xSeries 336—Mozilla Firefox [Undated].

*Primary Examiner*—Jayprakash N Gandhi
*Assistant Examiner*—Anthony M Haughton

(57) ABSTRACT

An electronic device includes a panel having a display screen that moves along a first axis and pivots about a second axis perpendicular to the first axis.

38 Claims, 4 Drawing Sheets

U.S. PATENT DOCUMENTS

| | | |
|---|---|---|
| 6,816,361 B2 | 11/2004 | Kuo |
| 6,816,389 B1 | 11/2004 | Lutz et al. |
| 8,616,177 * | 11/2004 | Wang et al. ................. 345/156 |
| 6,827,581 B2 | 12/2004 | Ho et al. |
| 2004/0042168 A1* | 3/2004 | Yang et al. .................. 361/685 |
| 2008/0023416 A1* | 1/2008 | Huang ......................... 211/26 |

* cited by examiner

ELECTRONIC DEVICE DISPLAY PANEL

BACKGROUND

Information regarding the initial configuration, control or operation and servicing of an electronic device is sometimes found in an instruction manual. Accurately identifying the appropriate instructions in a manual to address a particular need may be difficult. Moreover, in many circumstances, the task of locating the correct instruction manual for the particular electronic device is difficult and time consuming.

DETAILED DESCRIPTION OF THE EXAMPLE EMBODIMENT

Figure 1:
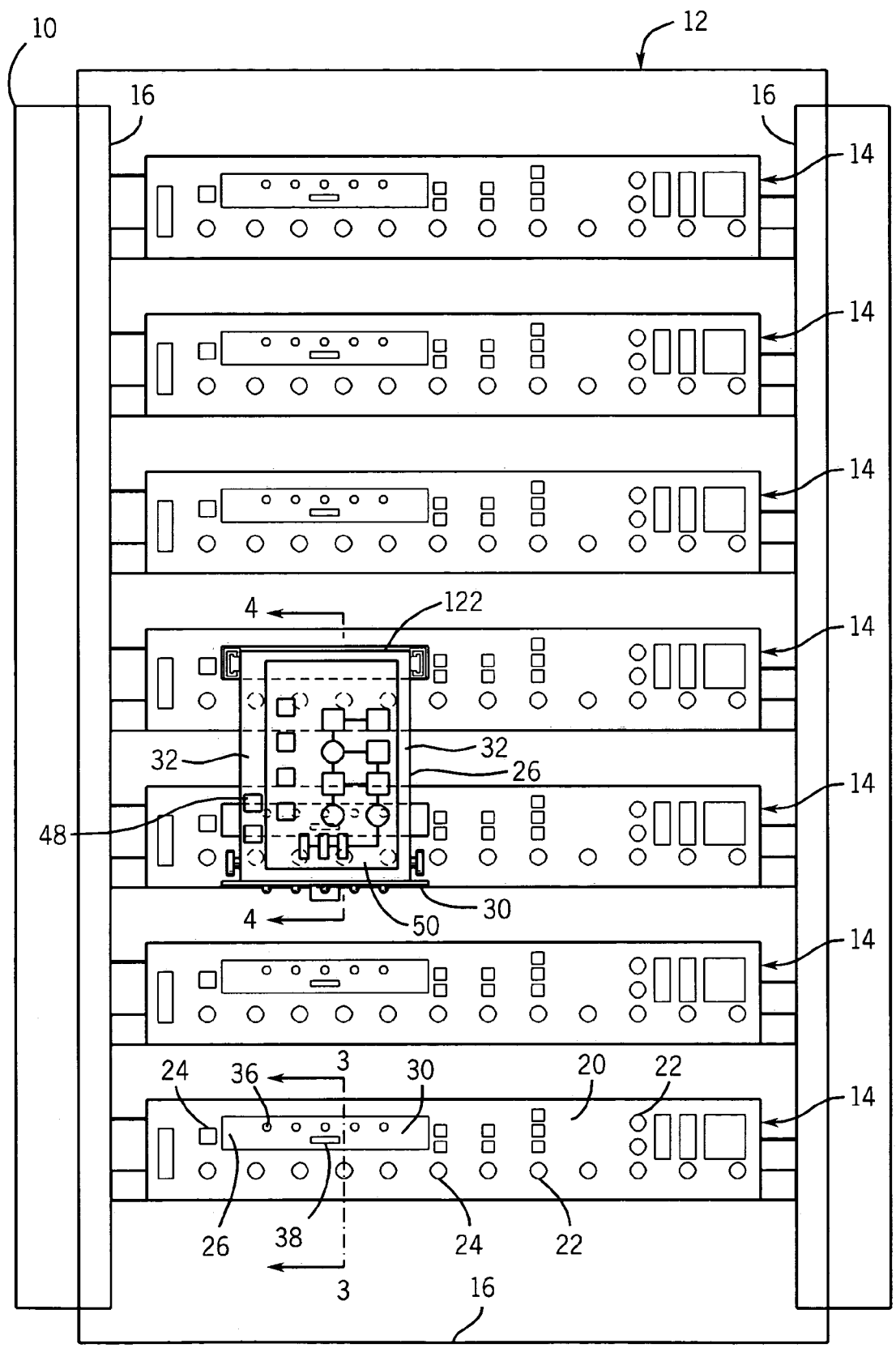
FIG. 1 is a front elevational view of an electronic system including a plurality of electronic devices according to one exemplary embodiment.

FIG. 1 is a front elevational view of an electronic system 10 which generally includes vertical support unit 12 and electronic devices 14. Vertical support unit 12 generally comprises a structure configured to support electronic devices 14 in vertically arranged or stacked relationship. As a result, electronic devices 14 may be compactly arranged and stored without occupying large volumes of space. In the embodiment shown, vertical support unit 12 comprises a rack having four corner posts 16 and intermediate frame members (not shown) joined to one another so as to substantially enclose electronic devices 14 which are mounted within a volume defined by the four corner posts 16. In one particular embodiment, electronic devices 14 are configured to slide or otherwise move outwardly beyond corner post 16 to improved access to electronic devices 14. In other embodiments, vertical support unit 12 may comprise other structures such as a cabinet, housing or the like including horizontal shelves upon which electronic devices 14 may rest.

Electronic devices 14 comprise electrical devices configured to perform one or more computing functions. In the particular example illustrated, each electronic device 14 includes a front face 20 including a multitude of indicators 22, operator inputs 24 and a display panel 26. Indicators 22 are located across face 20 and are configured to indicate to a person an operating status of device 14. For example, indicators 22 may indicate a malfunction or a dangerous condition. In one particular embodiment, indicators 22 comprise light-emitting diodes.

Operator inputs 24 comprise mechanisms configured to permit operators or persons to interface with device 14. In one embodiment, operator inputs 24 may comprise push buttons, slide bars, dials, toggle switches and the like. For example, operator inputs 24 may permit an operator to power on device 14 or to select a particular mode of operation.

Display panel 26 comprises a panel housed within electronic device 14 and configured to provide an operator with information regarding the initial configuration, control or operation and servicing of electronic device 14. As shown by FIG. 1, display panel 26 includes an end face 30 and a display face 32. End face 30 generally extends along face 20 of device 14 when panel 26 is recessed or contained within device 14. Face 30 includes operation indicators 36 and operator input 38. Indicators 36 indicate an operational status of electronic device 14. Input 38 comprises a mechanism configured to enable an operator to interface or input information or instructions to electronic device 14. In one embodiment, indicators 36 may comprise light-emitting diodes. Input 38 may comprise push buttons, switches, slides and the like.

Face 32 of display panel 26 generally extends perpendicular to face 30. As shown by FIG. 1, face 32 has a much greater surface area as compared to face 30. In the example shown, face 32 has a much greater surface area than face 20 of electronic device 14. When display panel 26 is withdrawn from electronic device 14, face 32 of display panel 26 extends over face 20 and outwardly beyond face 20. In embodiments wherein multiple electronic devices are arranged in close vertical proximity to one another as shown in FIG. 1, face 32 additionally overlaps face 20 of an adjacent electronic device 14. Because face 32 overlies and extends outwardly beyond face 20 of electronic device 14, face 32 provides electronic device 14 with additional surface area for communicating with an operator by displaying information to the operator and/or for receiving input from the operator. At the same time, because display panel 26 may be retracted into electronic device 14, display panel 32 may be compactly stored when not in use, allowing electronic devices 14 to be closely arranged relative to one another and allowing substantially all the indicators 22, 36 and inputs 24, 38 along faces 20 and 30, respectively, to be viewed and utilized.

Figure 2:
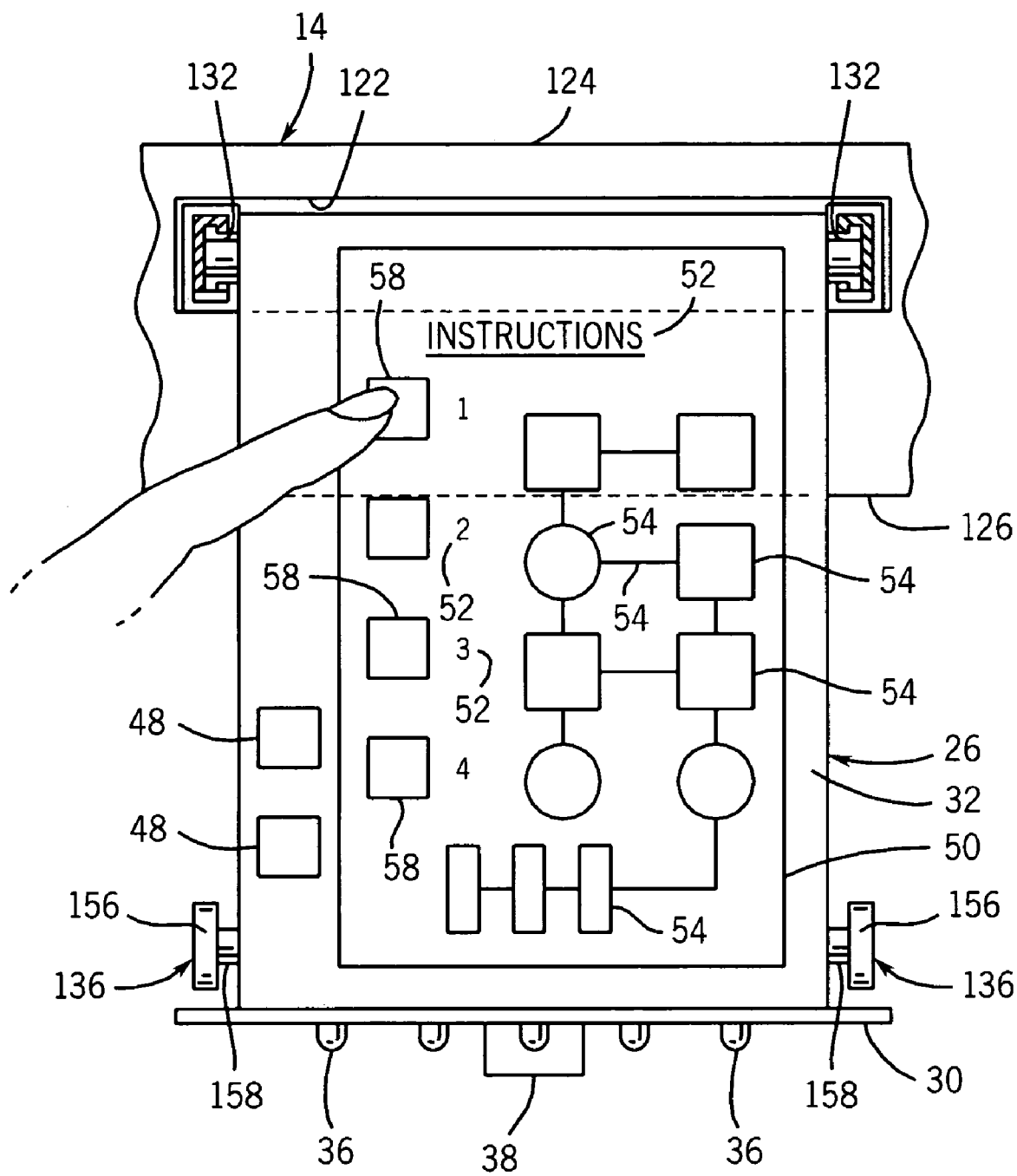
FIG. 2 is an enlarged fragmentary front perspective view of one of the electronic devices of FIG. 1 with a display panel in an extended position according to one exemplary embodiment.

FIG. 2 illustrates face 32 of display panel 26 in greater detail. As shown by FIG. 2, face 32 of display panel 26 includes operator inputs 48 and display screen 50. Operator inputs 48 comprise mechanisms configured to enable an operator to further interface with electronic device 14. In the particular embodiment illustrated, operator inputs 48 comprise push buttons. In other embodiments, operator inputs 48 may comprise other mechanisms such as slides, switches, dials and the like. In one particular embodiment, operator input 48 facilitate an operator inputting information or instructions related to information displayed upon screen 50.

Display screen 50 comprises a screen configured to display visual information in a non-binary fashion. In contrast to light-emitting diodes which merely communicate information based on whether such lights are on or off, display screen 50 is configured to present variable information which is more easily readable and adjustable to communicate a wide range of information. In the embodiment shown, display screen 50 is configured to display alpha-numeric symbols 52, as well as various images or graphics 54. In one embodiment, display screen 50 is configured to display animated or video clips. In one embodiment, display screen 50 is configured to display information regarding the initial configuration, control or operation and/or servicing or electronic device 14. Because display screen 50 provides such information, an operator may not need to hunt down an appropriate instruction manual for electronic device 14. Moreover, display screen 50 may be configured to present the appropriate information for performing a particular task such as configuring electronic device 14, controlling the operation of electronic device 14 or servicing electronic device 14. For example, when electronic device 14 is initially placed in service, display screen 50 may be configured to automatically display set up or configuration instructions. In response to a sensed malfunction, display screen 50 may be configured to display the appropriate instructions (potentially along with graphics)

describing how to repair or service electronic device 14. Display screen 50 may also be configured to provide a menu of potential operations for which electronic device 14 is configured to perform.

In the particular example illustrated, display screen 50 is configured to also serve as a touch screen, providing a touch or pressure sensitive surface. As shown in FIG. 2, display screen 50 may be configured to depict graphics or icons 58 that may be depressed or touched so as to also serve as operator inputs. Such icons 58 may be presented at different locations upon screen 50 and may be associated with varying alpha-numeric symbols or other graphics to provide a customized interface with an operator. For example, in one embodiment, display screen 50 may present a menu of potential operations, wherein an operator may select one of the operations by depressing or touching a portion of screen 50 associated with a presented icon 58.

In one embodiment, display screen 50 comprises a liquid crystal display. In other embodiments, display screen 50 may comprise various other pressure sensitive or touch screens configured to also serve as an input as well as other non-touch screens.

Figure 3:
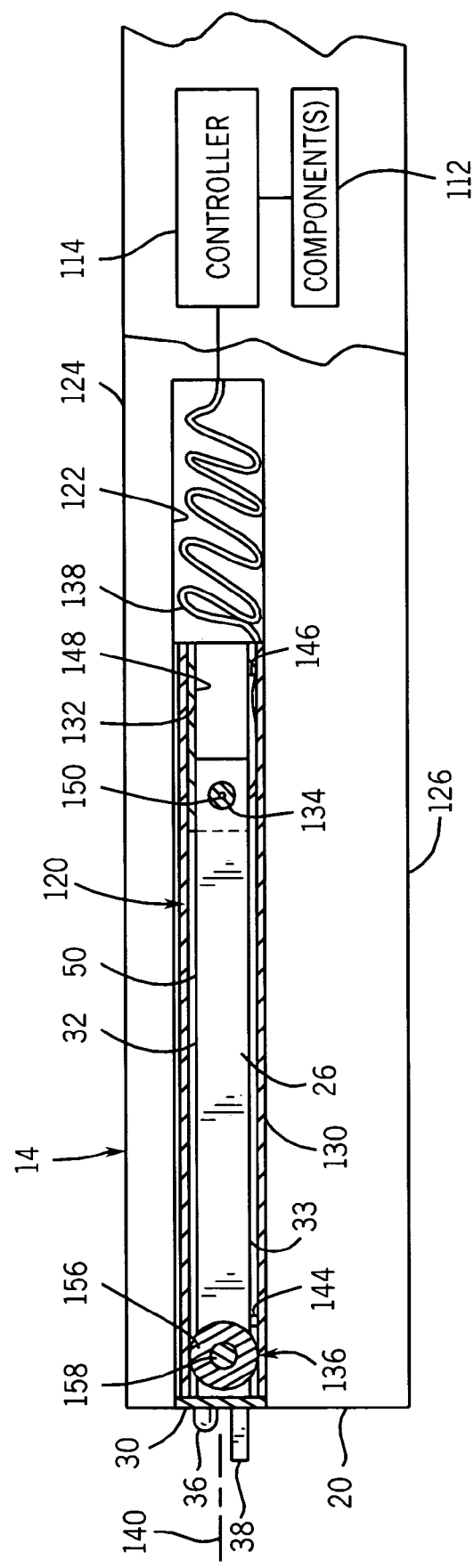
FIG. 3 is a sectional view of a system of FIG. 1 taken along line 3-3 according to one exemplary embodiment.
Figure 4:
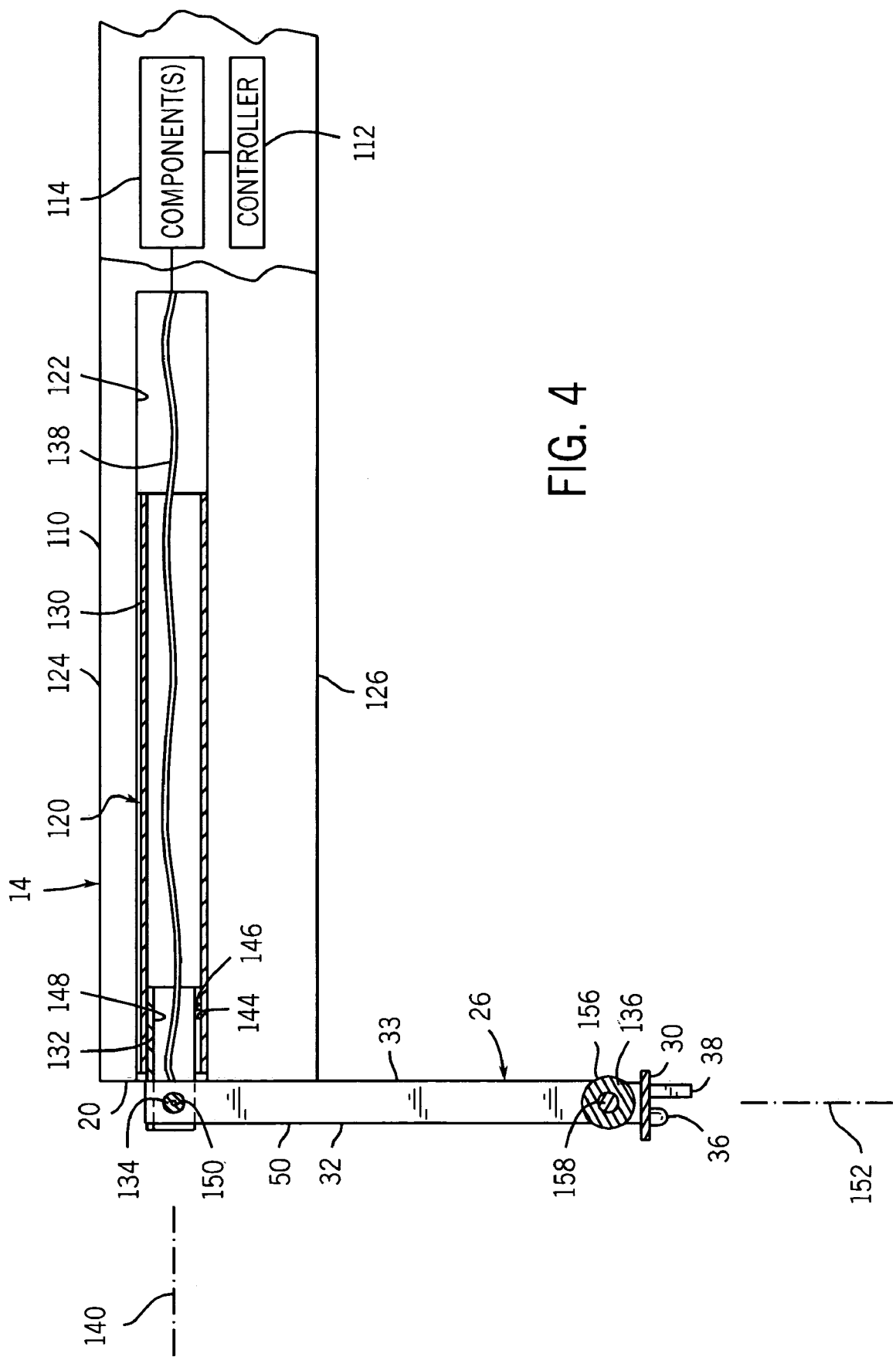
FIG. 4 is a sectional view of the system of FIG. 1 taken along line 4-4 according to one exemplary embodiment.

FIGS. 3 and 4 illustrate one example of electronic device 14 and display panel 26 in greater detail. FIG. 3 illustrates display panel 26 in the retracted position while FIG. 4 illustrates display panel 26 in an extended in-use position. As shown by FIGS. 3 and 4, in addition to display panel 26, electronic device 14 includes housing 110, component 112, controller 114 and display panel retraction and extension system 120. Housing 14 generally comprises one or more structures configured to surround and enclose component(s) 112 and controller 114. In addition, housing 110 includes an internal cavity 122 in which retraction and extension system 120 is substantially contained and in which display panel 26 is received when in the retracted position shown in FIG. 3. As described above, housing 14 includes a front face 20. Housing 14 additionally includes faces 124 and 126 which are substantially perpendicular to face 20. Faces 124 and 126 each have a greater surface area as compared to the surface area of face 20. As shown by FIG. 1, faces 124 and 126 face opposite electronic devices 14 when electronic devices 14 are stacked in a vertical or side-by-side relationship.

Component(s) 112 and controller 114 form the main functioning portions of electronic device 14. Component(s) 112 may comprise one or more power supplies, processor units, memory units and the like associated with electronic device 14. Controller 114 comprises a processing unit associated with components 112 and display screen 26. For purposes of this disclosure, the term "processing unit" shall mean a conventionally known or future developed processing unit that executes sequences of instructions contained in a memory. Execution of the sequences of instructions causes the processing unit to perform steps such as generating control signals. The instructions may be loaded in a random access memory (RAM) for execution by the processing unit from a read only memory (ROM), a mass storage device, or some other persistent storage. In other embodiments, hard wired circuitry may be used in place of or in combination with software instructions to implement the functions described. Controller 114 is not limited to any specific combination of hardware circuitry and software, nor to any particular source for the instructions executed by the processing unit.

In the particular embodiment illustrated, controller 114 generates control signals directing display screen 50 and display panel 26 to display information regarding the initial configuration, controller operation and servicing of electronic device 14. Controller 114 further receives electrical signals from inputs 48, as well as the touch or pressure sensitive portions of screen 50 serving as input and generates control signals based upon such input. Components 112 perform their individual functions in response to control signals generated by controller 114. In one particular embodiment, electronic device 14 comprises a server. In other embodiments, electronic device 14 may comprise other types of electronic devices.

Retraction and extension system 120 comprises a mechanism configured to facilitate movement of display panel 26 between the retracted position shown in FIG. 3 and the extended position shown in FIG. 4. System 120 generally includes track 130, sled 132, hinge 134, bearings 136 and connector 138. Track 130 comprises a structure within cavity 122 that is configured to guide movement of sled 132 along axis 140 and to further guide movement of display panel 26 along axis 140. Track 130 includes a stop surface 144 configured to capture sled 132 within cavity 122 and to prevent disconnection of sled 132 from track 130. In one embodiment, track 130 comprises an elongate hollow rectangular structure positioned within cavity 122 providing a low friction structure in which sled 132 may slide. In other embodiments, track 130 may comprise other structures such as rails and the like and may use other means for facilitating movement of sled 132 such as roller or ball bearings and the like.

Sled 132 comprises a structure received within cavity 122 and coupled to track 130 so as to slide or otherwise move within cavity 122. Sled 132 includes a stop surface 146 configured to abut top surface 144 of track 130 so as to limit withdrawal of sled 132 from track 130 and from cavity 122. In the particular example shown, sled 132 further includes an opening 148 configured to facilitate the passage of connector 138 to display panel 26. In other embodiments, sled 132 may have various other shapes, sizes and configurations. In lieu of sliding relative to track 130, sled 132 may alternatively include rotatable wheels, rollers or other structures configured to facilitate relative movement of sled 132 to track 130.

Hinge 134 pivotally connects display panel 26 to sled 132. Hinge 134 enables display panel 26 to pivot about axis 150 between the position shown in FIG. 3 in which display panel 26 extends along axis 140 and the position shown in FIG. 4 in which display panel 26 extends non-parallel to axis 140. In the particular example shown, hinge 134 facilitates pivoting of display panel 26 to a position along axis 152 which is substantially perpendicular to axis 140. In the particular example shown, hinge 134 enables display panel 26 to pivot under the force of gravity about axis 150 until rear face 33 of display panel 26 abuts front face 20. In other embodiments, hinge 134 may be configured to enable display panel 26 to pivot to other orientations oblique to axis 140. In one embodiment, hinge 134 comprises a pin pivotally connecting display panel 26 and sled 132. In other embodiments, hinge 134 may comprise other mechanical hinge mechanisms or may comprise a flexible or bendable material coupled between panel 26 and sled 132 so as to form a living hinge.

Bearings 136 generally comprise structures coupled to display panel 26 proximate to face 30 and configured to facilitate movement of panel 26 within cavity 122. In the particular example illustrated, bearings 136 comprise rollers 156 rotatably supported about axles 158 and having an outer diameter greater than the thickness of panel 26 so as to movably support panel 26 within cavity 122 and along track 130. In other embodiments, bearings 136 may comprise other structures configured to facilitate movement of panel 26 within cavity 122. In particular embodiments, bearings 136 may be omitted.

Connector 138 comprises one or more electrical conductors configured to transmit electrical power and electrical signals to and from panel 26. In one particular embodiment, connector 138 electrically connects panel 26 to controller 114. In one embodiment, connector 138 comprises one or more flexible conductors extending between panel 26 and controller 114, such as a flexible circuit. As shown in FIG. 3, when panel 26 is in the retracted position, connector 138 folds or collapses within cavity 122. As shown by FIG. 4, when panel 26 is extended, connector 138 also extends and passes through cavity 122.

Overall, display panel 26 and its display screen 50 provide an operator with information regarding the initial configuration, controller operation and servicing of electronic device 14 without the operator having to search for and locate an instruction manual. In one embodiment, upon initial setup, display screen 50 provides an operator with detailed instructions and visual graphics or videos depicting the process or steps for setting up or configuring electronic device 14. In one embodiment, display screen 50 provides an operator with information regarding the control or operation of electronic device 14. In one embodiment, display screen 50 provides the operator with a menu and a touch screen for allowing the operator to select a particular operational state for electronic device 14. In still another embodiment, display screen 50 alerts an operator to a malfunction or a need for servicing of electronic device 14 through indicator 36 on face 30. In response, the operator may pull display panel 26 from the retracted position to the extended position shown in FIG. 4 to view graphics or a video providing the operator with instructions for servicing electronic device 14, an image of the defective or malfunctioning part or component of electronic device 14 or contact information for ordering a new component or part, or for requesting assistance in repairing electronic device 14. Although providing such a vast amount of information, display panel 26 does not require a large amount of space. Rather, when not in use, display panel 26 may be compactly stored in the retracted position shown in FIG. 3. As a result, electronic device 14 is more compact and a greater number of electronic devices 14 may be arranged in a stacked vertical or horizontal arrangement such as shown in FIG. 1.

Although the present disclosure has been described with reference to example embodiments, workers skilled in the art will recognize that changes may be made in form and detail without departing from the spirit and scope of the claimed subject matter. For example, although different example embodiments may have been described as including one or more features providing one or more benefits, it is contemplated that the described features may be interchanged with one another or alternatively be combined with one another in the described example embodiments or in other alternative embodiments. Because the technology of the present disclosure is relatively complex, not all changes in the technology are foreseeable. The present disclosure described with reference to the example embodiments and set forth in the following claims is manifestly intended to be as broad as possible. For example, unless specifically otherwise noted, the claims reciting a single particular element also encompass a plurality of such particular elements.

What is claimed is:

1. An electronic device comprising:
    a panel having a display screen linearly movable along a first axis and pivotable about a second axis perpendicular to the first axis, wherein the display screen is on a first face of the panel and wherein the device further comprises a signal light on a second face of the panel; and
    a housing receiving the panel, wherein the panel is linearly movable between a retracted position within the housing and an extended position out of the housing; and
    a controller configured to generate control signals in response to a servicing need such that the signal light changes state to indicate the servicing need while the panel is in the retracted position and such that additional information regarding the servicing need is presented on the display screen when the panel is in the extended position.

2. The device of claim 1, wherein the signal light comprises a light emitting diode.

3. The device of claim 1, wherein the second face is perpendicular to the first face.

4. The device of claim 1 including a flexible electrical connector having a first end connected to the panel and a second end connected to the electronic component.

5. The device of claim 1 wherein the housing forms a cavity along the first axis receiving the panel.

6. The device of claim 5, wherein the second face of the panel faces outward from the cavity when the panel is received within the cavity.

7. The device of claim 5 including a track configured to guide linear movement of the display along the first axis.

8. The device of claim 1 including a track configured to guide linear movement of the display along the first axis.

9. The device of claim 1, wherein the housing has a housing face perpendicular to the first axis.

10. The device of claim 9, wherein the panel pivots between a first position substantially perpendicular to the housing face and a second position substantially parallel to the housing face.

11. The device of claim 1, wherein the controller is configured to generate control signals causing the display screen to provide at least one image providing instructions on at least one of configuring, controlling or servicing of the electronic device.

12. The device of claim 11, wherein the at least one image includes a video clip.

13. The device of claim 1, wherein the controller is configured to generate control signals causing the display screen to provide at least one image including alpha-numeric symbols.

14. The device of claim 1, wherein the panel further includes an operator input interface on the second face.

15. The device of claim 1, wherein the display screen comprises a touch sensitive screen configured to receive operator input.

16. The device of claim 1, wherein the display screen comprises a liquid crystal display screen.

17. The device of claim 1, wherein the panel pivots to a position in which the panel and the display screen extend in a plane parallel to the first axis.

18. A system comprising:
    a plurality of electronic devices supported in a stacked relationship along a first axis, each of the devices including a panel having a display screen on a first face, wherein the panel is linearly movable along a second axis perpendicular to the first axis between a retracted position and an extended position and pivotable about a third axis perpendicular to the first axis and the second axis;
    a signal light on a second face of the panel; and
    a controller configured to generate control signals in response to a servicing need such that the signal light changes state to indicate the servicing need while the panel is in the retracted position and such that additional information regarding the servicing need is presented on the display screen when the panel is in the extended position.

19. The system of claim 18, wherein the controller is configured to generate control signals causing the display screen to provide at least one image providing instructions on at least one of configuring, controlling or servicing of the electronic device.

20. The system of claim 19 wherein the at least one image includes a video clip.

21. The system of claim 18, wherein the controller is configured to generate control signals causing the display screen to provide at least one image including alpha-numeric symbols.

22. The system of claim 18, wherein the panel includes an operator input interface on the first face.

23. The system of claim 18 wherein the display screen comprises a touch sensitive screen configured to receive operator input.

24. The system of claim 18, wherein the at least one electronic device has a housing forming a cavity along the second axis that receives the panel.

25. The system of claim 24 including a track configured to guide linear movement of the panel along the second axis.

26. The system of claim 18, wherein the plurality of electronic components each has a housing having a major face facing in a direction along the first axis and a minor face facing in a direction along the second axis.

27. The system of claim 18, wherein the at least one electronic device includes a server.

28. The system of claim 18, wherein the panel pivots between a first position substantially parallel to the second axis and a second position substantially parallel to the first axis.

29. The system of claim 18, wherein the plurality of electronic devices includes and upper device and a lower device and wherein the display screen of the upper device is pivotable about the third axis to a position overlapping the lower device.

30. A method comprising:
    providing a panel having a display screen on a first face of the panel and an indicator on a second face of the panel;
    providing a servicing alert on the indicator;
    linearly moving a the panel along a first axis in response to the alert;
    pivoting the panel and the display screen about a second axis perpendicular to the first axis after the linearly moving of the panel; and
    displaying servicing information on the display screen.

31. The method of claim 30 including withdrawing the panel from a cavity while moving the panel along the first axis.

32. The method of claim 30, wherein the first axis extends parallel to a major surface of a housing coupled to the panel.

33. The method of claim 30 including presenting an image on the display screen.

34. The method of claim 33, wherein the image includes at least one alpha-numeric symbol.

35. The method of claim 30 including presenting at least one image on the screen providing instructions on at least one of configuring, controlling or servicing of an electronic device associated with the panel.

36. The method of claim 30, wherein the display screen is on a first face of the panel and wherein the method further includes receiving input via an input interface on the first face.

37. An electronic device comprising:
    a panel having a display screen linearly movable along a first axis and pivotable about a second axis perpendicular to the first axis;
    a housing forming a cavity along the first axis receiving the panel, wherein the display screen is on a first face of the panel;
    a signal light on a second face of the panel, wherein the second face of the panel faces outward from the cavity when the panel is received within the cavity; and
    a controller configured to generate control signals initiating the display of new information on the display screen and causing the signal light to changes state while the panel is received within the cavity to indicate that the new information is available on the display screen and such that the new information on the display screen may be viewed by withdrawing the panel from the cavity.

38. The device of claim 37, wherein the panel further includes an operator input interface on the second face.

* * * * *

UNITED STATES PATENT AND TRADEMARK OFFICE
CERTIFICATE OF CORRECTION

PATENT NO.         : 7,436,674 B2                                    Page 1 of 1
APPLICATION NO.    : 11/104252
DATED              : October 14, 2008
INVENTOR(S)        : Stephan K. Barsun et al.

It is certified that error appears in the above-identified patent and that said Letters Patent is hereby corrected as shown below:

On the title page: item (56), under "U.S. Patent Documents", in column 1, line 3, delete "8,616,177" and insert -- 6,816,177 B2 --, therefor.

In column 7, line 9, in Claim 20, after "claim 19" insert -- , --.

In column 7, line 17, in Claim 23, after "claim 18" insert -- , --.

In column 7, line 36, in Claim 29, after "includes" delete "and" and insert -- an --, therefor.

Signed and Sealed this

Twenty-fourth Day of March, 2009

JOHN DOLL
*Acting Director of the United States Patent and Trademark Office*